United States Patent [19]
Honda et al.

[11] Patent Number: 5,250,917
[45] Date of Patent: Oct. 5, 1993

[54] EQUIVALENT INDUCTANCE CIRCUIT

[75] Inventors: Fumiaki Honda, Takatsuki; Nobukazu Hosoya, Nara, both of Japan

[73] Assignee: Sanyo Electric Co., Ltd., Osaka, Japan

[21] Appl. No.: 875,797

[22] Filed: Apr. 28, 1992

[30] Foreign Application Priority Data

Apr. 30, 1991 [JP] Japan .................. 3-098889

[51] Int. Cl.⁵ ......................... H03H 11/00
[52] U.S. Cl. ......................... 333/214; 307/520; 330/306
[58] Field of Search .............. 330/107, 260, 306; 307/520; 328/167; 333/214

[56] References Cited

U.S. PATENT DOCUMENTS

| | | | |
|---|---|---|---|
| 3,792,367 | 2/1974 | Fleischer et al. | 328/167 X |
| 4,318,054 | 3/1982 | Yokoyama | 330/302 |
| 5,124,592 | 6/1992 | Hagino | 330/306 X |

FOREIGN PATENT DOCUMENTS

53-18362 2/1978 Japan.
1-208011 8/1989 Japan.

OTHER PUBLICATIONS

Nandi, "New Ideal Active Inductance and Frequency-Dependent Negative Resistance Using D.V.C.C.S./D.V.C.V.S. Applications in Sinusoidal-Oscillator Realization", *Electronics Letters*, vol. 14, No. 17, Aug. 17, 1978, pp. 551-553.

*Primary Examiner*—James B. Mullins
*Attorney, Agent, or Firm*—Armstrong, Westerman, Hattori, McLeland & Naughton

[57] ABSTRACT

An equivalent inductance circuit includes a feedback type integration circuit and a differential amplifying circuit. An input signal applied to an input terminal is integrated by the feed-back type integration circuit and, a signal according to a difference component between an integrated output signal and the input signal is outputted by the differential amplifying circuit. By feeding the difference signal back to the input terminal, an input impedance equivalently represents an inductance characteristic. Such equivalent inductance can be changed by a current from a variable current source which supplies the current to the differential amplifying circuit and, a change of the equivalent inductance shows an inverse proportional manner.

3 Claims, 3 Drawing Sheets

F I G. 1
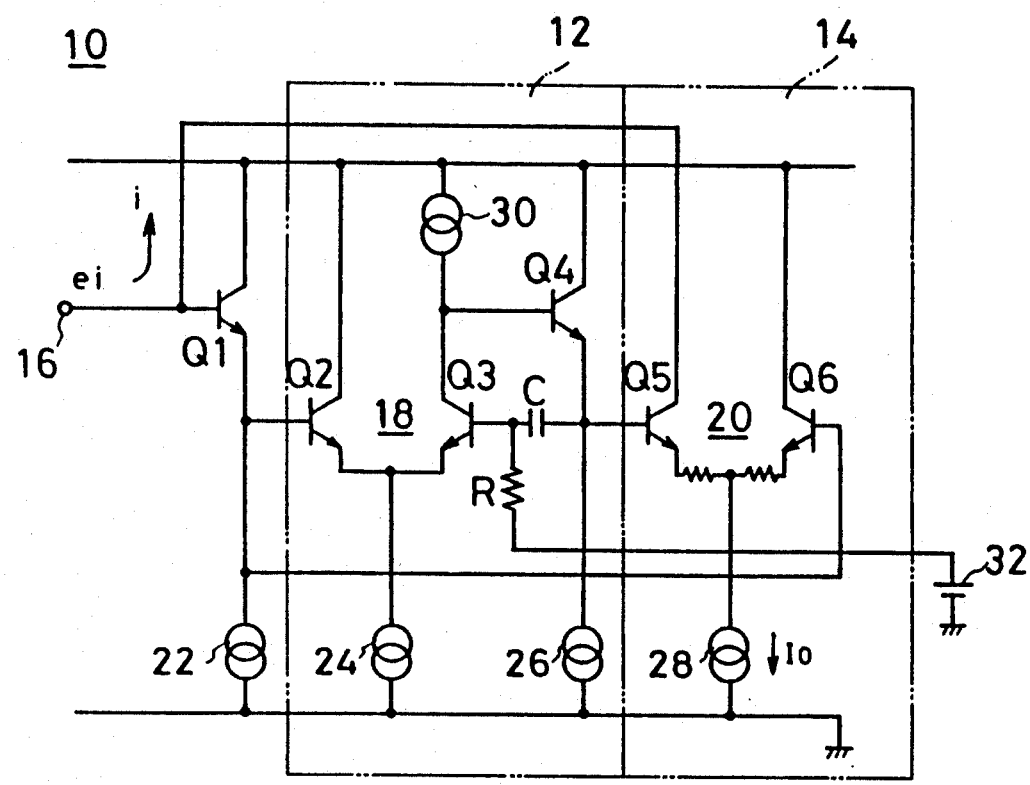

5,250,917

EQUIVALENT INDUCTANCE CIRCUIT

BACKGROUND OF THE INVENTION

1. Field of the Invention

The present invention generally relates to an equivalent inductance circuit. More specifically, the present invention relates to an equivalent inductance circuit which includes semiconductor devices so as to be built in an IC (integrated circuit).

2. Description of the Prior Art

One example of a conventional technique of such a kind of equivalent inductance circuit is disclosed in Japanese Patent Laying-Open No. 53-18362 laid-open on Feb. 20, 1978, and Japanese Patent Laying-Open No. 1-208011 laid-open on Aug. 22, 1989.

The former is a semiconductor inductance element in which a current being in proportion to an input voltage is outputted by a voltage-current conversion circuit, and an output current is integrated, and an integrated output is converted into a current by a further voltage-current conversion circuit so as to feed the current back to an input signal source.

The latter is a current-controlled gyrator in which two differential amplifying circuits are connected in parallel to each other, and a capacitor is connected between inputs of one differential amplifying circuit and a voltage-current conversion circuit is provided at an output of any one of the differential amplifying circuits.

In such equivalent inductance circuits, it is necessary to adjust an equivalent inductance due to a change of a temperature characteristic of the semiconductor devices, variation or dispersion of the devices, and etc. In such a case, in the former, since the equivalent inductance is primarily decided by a resistor and a capacitor, it is impossible to control or adjust the equivalent inductance externally. In the latter, the equivalent inductance is given by the 42nd formula described in the official gazette of Japanese Patent Laying-Open No. 1-208011, the equivalent inductance can be changed by $I_0/I_1$, but a linear control characteristic can not be obtained according to the circumstances because a differential resistor re is dependent on $I_0$. That is, the equivalent inductance is changed in a linear manner with respect to the current $I_0$ when resistors $R_1$ and $R_2$ in the 42nd formula are sufficiently larger than the differential resistor 2re; however, in a case where the equivalent inductance is to be set smaller, since it is impossible to make the resisters $R_1$ and $R_2$ larger, an influence of the differential resistor 2re with respect to the inductance becomes larger, and therefore, the control characteristic of the equivalent inductance is changed.

SUMMARY OF THE INVENTION

Therefore, a principal object of the present invention is to provide an equivalent inductance in which an equivalent inductance can be changed with various changing characteristics or manners.

An equivalent inductance circuit in accordance with the present invention comprises an integration circuit for integrating an input signal; a differential circuit for detecting a difference component between an output signal from the integration circuit and the input signal; and a feed-back path for feeding a signal of the differential component detected by the differential circuit back to the input signal. A signal dividing circuit may be added to the circuit having the above described structure.

By feeding the differential signal from the differential circuit back to the input signal, equivalently, an input impedance substantially represents an inductance characteristic. Then, an equivalent inductance is in reverse proportion to a current supplied to the differential circuit and in proportion to a current supplied to the signal dividing circuit.

In accordance with the present invention, by changing a current supplied to the differential circuit or the signal dividing circuit, it is possible to adjust or control the equivalent inductance externally and to select a changing manner of the equivalent inductance in accordance with usage of the equivalent inductance circuit.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing one embodiment according to the present invention;

DETAILED DESCRIPTION OF THE PREFERRED EMBODIMENTS

Figure 2:
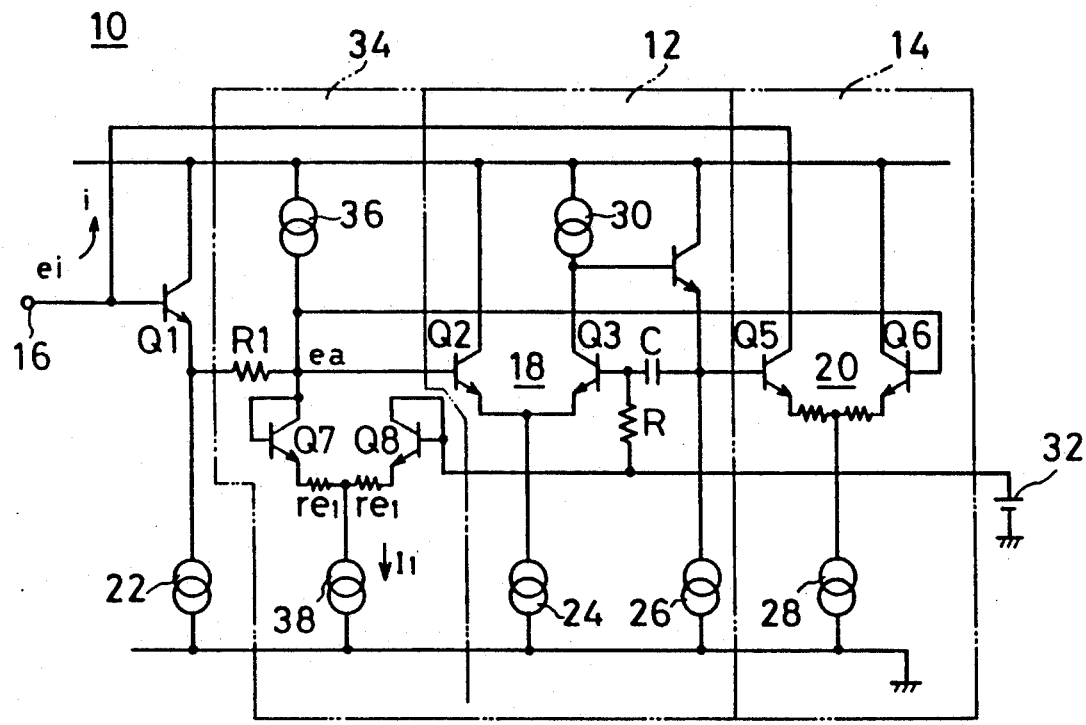
FIG. 2 is a circuit diagram showing another embodiment according to the present invention.

An equivalent inductance circuit 10 according to one embodiment of the present invention, shown in FIG. 1, includes a feed-back type integration circuit 12 and a differential amplifying circuit 14, and an input signal $e_i$ is applied from an input terminal 16. The input signal $e_i$ is inputted to a base of a transistor Q2 which is an input terminal of the integration circuit 12 through a transistor Q1 which constitutes an emitter follower. The transistor Q2 constitutes a differential pair 18 together with a transistor Q3. An output of the differential pair 18 is outputted at an emitter of a transistor Q4 from a collector of a transistor Q3. A series connection circuit of a capacitor C for integration and a resistor R is connected to the emitter of the transistor Q4. Then, the output of the differential pair 18, that is, the emitter of the transistor Q4 is connected to a base of a transistor Q5 of the differential amplifying circuit 14, and a base of a transistor Q6 which constitutes a differential pair 20 together with the transistor Q5 is connected to an output of the transistor Q1. An output of the transistor Q5 is fed-back to a base of the transistor Q1, that is, the input signal. In addition, in the equivalent inductance circuit 10 shown in FIG. 1, reference numerals 22, 24, 26, 28 and 30 respectively denote constant current sources (direct current current sources), and a reference numeral 32 denotes a bias voltage source (direct current voltage source).

In the equivalent inductance circuit shown in FIG. 1, on the assumption that the input signal is $e_i$ and the capacitor C and the resistor R are used, an output signal $E_o$ of the integration circuit 12 which is outputted on the emitter of the transistor Q4 is given by the following equation 1.

$$e_o = \left(1 + \frac{1}{j\omega CR}\right)e_i \quad (1)$$

In addition, the output signal $e_o$ of the integration circuit 12 is applied to one input of the differential pair 20 of the differential amplifying circuit 14 and the input signal $e_i$ is applied to the other input of the differential pair 20. Therefore, a current i which flows-in from the input terminal 16 is given by the following equation 2 on the assumption that a differential resistor of each of the transistors Q5 and Q6 is re.

$$\begin{aligned} i &= \frac{e_o - e_i}{2re} \\ &= \frac{1}{2re}\left\{\left(1 + \frac{1}{j\omega CR}\right)e_i - e_i\right\} \\ &= \frac{e_i}{j\omega CR \cdot 2re} \end{aligned} \quad (2)$$

If $L = CR \cdot 2re$, the equation 2 becomes the following equation 3.

$$i = \frac{e_i}{j\omega L} \quad (3)$$

Therefore, an equivalent inductance L in the equivalent inductance circuit 10 is given by the following equation 4.

$$L = CR \cdot 2re = \frac{104CR}{I_0} \quad \left[\because re = \frac{26}{I_0/2}\right] \quad (4)$$

Thus, the equivalent inductance L obtained by the equivalent inductance circuit 10 shown in FIG. 1 is decided by the capacitor C, the resistor R and the current $I_0$.

The current $I_0$ supplied to the differential pair 20, that is, the current of the constant current source 28 can be easily changed by applying a control voltage to a base of a transistor (not shown) which constitutes the constant current source 28. Therefore, in this constant current source 28 by which the current $I_0$ can be changed, a variable equivalent inductance circuit is obtainable. In addition, in this embodiment shown, as seen from the equation 4, the equivalent inductance L is in inverse proportion to the current $i_0$.

An equivalent inductance circuit 10 shown in FIG. 2 is a circuit in which a signal dividing circuit 34 is added to the integration circuit 12 and the differential amplifying circuit 14 shown in FIG. 1. The signal dividing circuit 34 includes a transistor Q7 and a transistor Q8, and an input of the transistor Q7 is connected to the output of the transistor Q1 via a resistor R1, and an input of the transistor Q8 is connected to the bias voltage source 32. Then, in this embodiment shown in FIG. 2, constant current sources (direct current current sources) 36 and 38 are used.

In the equivalent inductance circuit 10 shown in FIG. 2, if the input signal $e_i$ is applied from the input terminal 16, the input signal $e_i$ is attenuated by the signal dividing circuit 34, and therefore, an output signal $e_a$ of the signal dividing circuit 34 is given by the following equation 5 on the assumption that a differential resistor of each of the transistors Q7 and Q8 is $re_1$.

$$e_a = \frac{2re_1}{R_1 + 2re_1} e_i \quad \left[re_1 = \frac{26}{I_1/2} = \frac{52}{I_1}\right] \quad (5)$$

The output signal $e_a$ shown by a equation 5 is integrated by the integration circuit 12 as similar to FIG. 1 embodiment, and therefore, the output signal $e_o$ of the integration circuit 12 is given by the following equation 6.

$$e_o = \left(1 + \frac{1}{j\omega CR}\right)e_a \quad (6)$$

Then, the current i which flows-in from the input terminal 16 is given by the following equation 7 and the equivalent inductance L is given by the following equation 8.

$$\begin{aligned} i &= \frac{e_o - e_a}{2re} \\ &= \frac{1}{2re}\left\{\left(1 + \frac{1}{j\omega CR}\right)e_a - e_a\right\} \\ &= \frac{1}{2re} \cdot \frac{1}{j\omega CR} e_a \\ &= \frac{1}{2re} \cdot \frac{1}{j\omega CR} \cdot \frac{2re_1}{R_1 + 2re_1} e_i \\ &= \frac{1}{j\omega CR \cdot 2re \cdot (R_1 + 2re_1)/2re_1} e_i \end{aligned} \quad (7)$$

$$\begin{aligned} L &= CR \cdot 2re \cdot \frac{R_1 + 2re_1}{2re_1} \\ &= 2CRre\left(1 + \frac{R_1}{2re_1}\right) \\ &= 2reCR\left(1 + \frac{R_1}{104}I_1\right) \end{aligned} \quad (8)$$

Thus, in the equivalent inductance circuit 10 shown in FIG. 2, by controlling the current $I_1$ of the constant current source 38 of the signal dividing circuit 34, it is possible to obtain the equivalent inductance L which is approximately in proportion to the current $I_1$.

Figure 3:
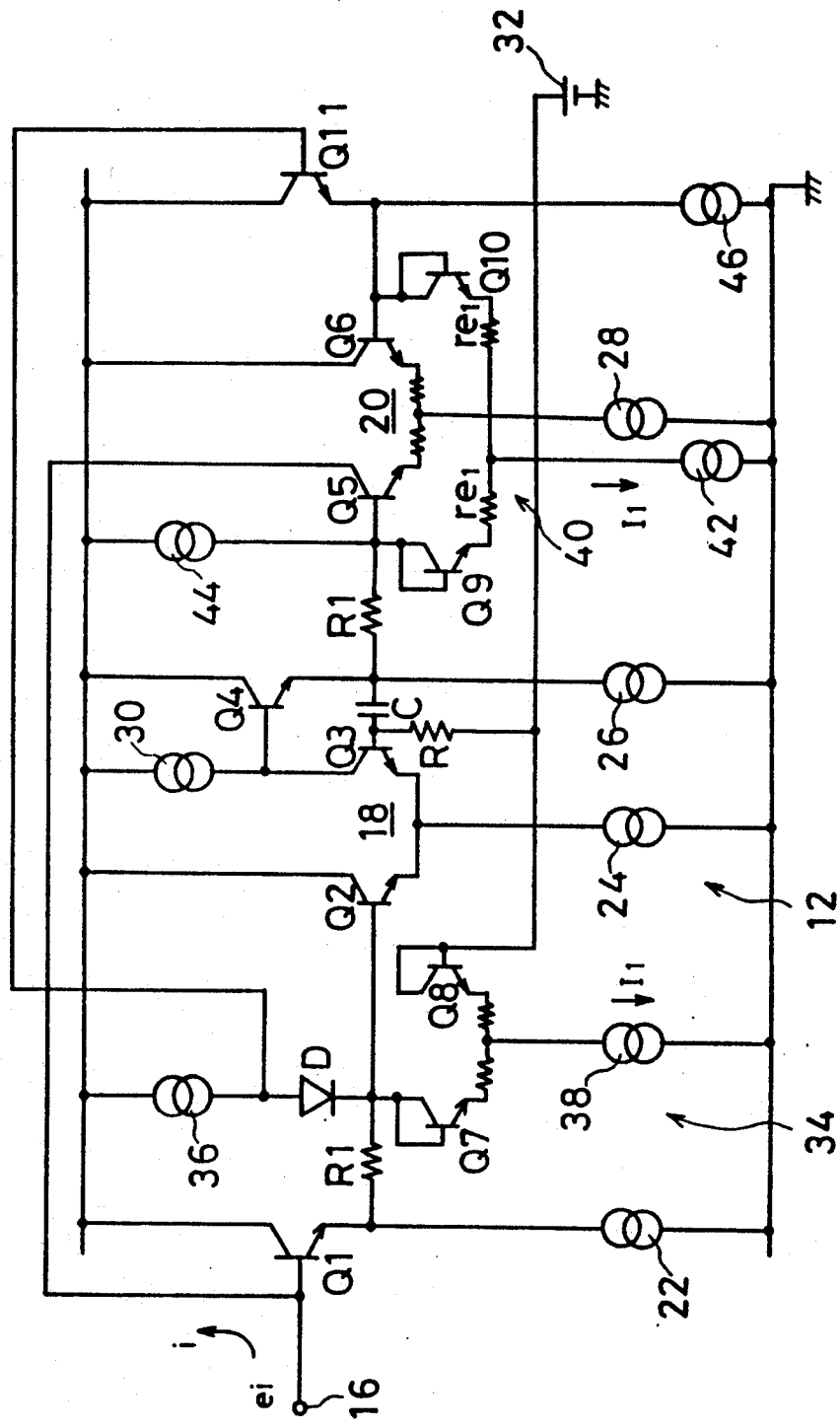
FIG. 3 is a circuit showing a still another embodiment according to the present invention.

An equivalent inductance circuit shown in FIG. 3 is a circuit in which a signal dividing circuit 40 which includes a resistor R1 and transistors Q9 and Q10 is further added to FIG. 2 embodiment. In addition, a diode D and a transistor Q11 shown in FIG. 3 are for adjusting biases of the two signal dividing circuits 34 and 40, and a variable constant current source 42 constitutes a current mirror circuit together with the variable current source 38, and therefore, the same current $I_1$ flows in the both sources 38 and 42. In addition, reference numerals 44 and 46 shown in FIG. 3 also denote constant current sources (direct current current sources).

In this embodiment shown in FIG. 3, although a description as to progress reaching a result is omitted here, an equivalent inductance L is given by the following equation 9.

$$L = 2reCR\left(\frac{R_1 + 2re_1}{2re_1}\right)^2 \quad (9)$$

$$= 2reCR\left(1 + \frac{R_1}{104}I_1\right)^2$$

That is, in the equivalent inductance circuit 10 according to the embodiment shown in FIG. 3, it is possible to obtain the equivalent inductance L which is in proportion to an approximately square of the current $I_1$ of the variable current sources 38 and 42.

In addition, in a case where FIG. 3 embodiment is applied to an all-pass filter, a phase shifting amount $T_o$ of the all-pass filter is given by the following equation 10 on the assumption that a resonant frequency of the all-pass filter is $f_o$, and therefore, by changing the current $I_1$, it is possible to linearly change the phase shifting amount To of the all-pass filter.

$$T_o = \frac{1}{f_o} = 2\pi\sqrt{LC} \quad (10)$$

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An equivalent inductance circuit, comprising:
an integration circuit for integrating an input signal, including two transistors connected as a differential pair, a capacitor connected to a base of one of said two transistors of said differential pair, and a resistor connected in series to said capacitor;
a differential circuit for detecting a difference component between an output signal of said integration circuit and said input signal, including two further transistors connected as a further differential pair, wherein said capacitor is connected to a base of one of said two further transistors of said further differential pair;
a feed-back path for feeding a signal of said difference component detected by said differential circuit back to said input signal; and
a selectively controllable constant current source connected to one coupled end of said further differential pair, such that an equivalent inductance formed by said integration circuit, said differential circuit, and said feed-back path varies inversely to the current controlled to flow through the selectively controllable constant current source.

2. An equivalent inductance circuit, comprising:
an input terminal for receiving an input signal;
a signal dividing circuit connected to said input terminal for outputting a divided signal having a magnitude according to a magnitude of a current which flows through said signal dividing circuit;
a first constant current source coupled to said signal dividing circuit for determining said magnitude of said current;
an integration circuit connected to an output of said signal dividing circuit, for integrating said divided signal from the output of said signal dividing circuit, said integration circuit including two transistors connected as a differential pair, a capacitor connected to a base of one of said two transistors of said differential pair, and a resistor connected in series to said capacitor;
a differential circuit for detecting a difference component between an output signal of said integration circuit and said input signal, including two further transistors connected as a further differential pair, wherein said capacitor is connected to a base of one of said two further transistors of said further differential pair;
a feed-back path for feeding a signal of said difference component detected by said differential circuit back to said input signal;
a second constant current source connected to one coupled end of said further differential pair; and
wherein said signal dividing circuit is connected between the input signal and one of said two transistors of said integration circuit, for dividing said input signal so as to apply said divided signal to said integration circuit, and an equivalent inductance formed by said integration circuit, said differential circuit, and said feed-back path varies in proportion to a current of said first constant current source.

3. An equivalent inductance circuit, comprising:
an input terminal for receiving an input signal;
a first signal dividing circuit connected to said input terminal for outputting a first divided signal having a magnitude according to a magnitude of first current which flows through said first signal dividing circuit;
a first constant current source coupled to said first signal dividing circuit for determining said magnitude of said first current;
an integration circuit connected to an output of said signal dividing circuit, for integrating said first divided signal from the output of said signal dividing circuit, said integration circuit including two transistors connected as a differential pair, a capacitor connected to a base of one of said two transistors of said differential pair, and a resistor connected in series to said capacitor;
a second signal dividing circuit connected to an output of said integration circuit for outputting a second divided signal having a magnitude according to a magnitude of a second current which flows through said second signal dividing circuit;
a second constant current source coupled to said second signal dividing circuit for determining said second current, said second current being equal to said first current;
a differential circuit for detecting a difference component between said second divided signal from said second signal dividing circuit and said input signal, including two further transistors connected as a further differential pair, wherein said capacitor is connected to a base of one of said two further transistors of said further differential pair; said differential circuit including a variable current source connected to said two further transistors for supplying a controlled current to said differential circuit;
a feed-back path for feeding a signal of said difference component detected by said differential circuit back to said input signal;
a third constant current source connected to one coupled end of said further differential pair; and wherein said first signal dividing circuit is connected between the input signal and one of said two transistors of said integration circuit, for dividing said input signal so as to apply said first divided signal to said integration circuit, and an equivalent inductance formed by said integration circuit, said differential circuit, and said feed-back path varies in proportion to approximately a square of said first or second current of said first or second constant current source.

* * * * *